(12) United States Patent
Kao et al.

(10) Patent No.: US 11,371,784 B2
(45) Date of Patent: Jun. 28, 2022

(54) HEAT DISSIPATION UNIT AND HEAT DISSIPATION DEVICE USING SAME

(71) Applicant: ASIA VITAL COMPONENTS (CHINA) CO., LTD., Shenzhen (CN)

(72) Inventors: Pai-Ling Kao, Shenzhen (CN); Dan-Jun Chen, Shenzhen (CN); Guo-Hui Li, Shenzhen (CN); Fu-Ming Zhong, Shenzhen (CN)

(73) Assignee: ASIA VITAL COMPONENTS (CHINA) CO., LTD., Shenzhen (CN)

( * ) Notice: Subject to any disclaimer, the term of this patent is extended or adjusted under 35 U.S.C. 154(b) by 146 days.

(21) Appl. No.: 16/745,351

(22) Filed: Jan. 17, 2020

(65) Prior Publication Data

US 2020/0232718 A1 Jul. 23, 2020

Related U.S. Application Data

(63) Continuation-in-part of application No. 16/251,077, filed on Jan. 18, 2019, now Pat. No. 11,193,718.

(51) Int. Cl.
*F28D 15/04* (2006.01)
*F28D 15/02* (2006.01)

(52) U.S. Cl.
CPC ....... *F28D 15/043* (2013.01); *F28D 15/0275* (2013.01)

(58) Field of Classification Search
CPC .. F28D 15/043; F28D 15/046; F28F 2215/06; F28F 2240/00; F28F 2250/10
See application file for complete search history.

(56) References Cited

U.S. PATENT DOCUMENTS

| 4,931,905 A | * | 6/1990 | Cirrito | H05K 7/20336 165/104.33 |
| 8,919,426 B2 | * | 12/2014 | Hardesty | F28D 15/0233 165/104.21 |
| 2010/0149755 A1 | * | 6/2010 | Tomioka | F28D 15/043 361/700 |
| 2016/0016246 A1 | * | 1/2016 | Bugby | F28D 15/043 228/101 |

FOREIGN PATENT DOCUMENTS

| CN | 108336048 A | 7/2018 |
| CN | 108803837 A | 11/2018 |
| TW | M452370 U | 5/2013 |

OTHER PUBLICATIONS

Search Report dated Jan. 22, 2021 issued by Taiwan Intellectual Property Office for counterpart application No. 108140474.

\* cited by examiner

*Primary Examiner* — Jon T. Schermerhorn, Jr.
(74) *Attorney, Agent, or Firm* — Demian K. Jackson; Jackson IPG PLLC

(57) ABSTRACT

A heat dissipation unit and a heat dissipation device using same are disclosed. The heat dissipation device includes a base and one or more heat dissipation units. The base has a first side and an opposite second side; and the heat dissipation units respectively include at least one radiation fin correspondingly provided on the first side of the base. The radiation fin is formed by correspondingly closing a first plate member and a second plate member to each other, such that a plurality of independent flow channels is defined between the closed first and second plate member. The independent flow channels communicate with each other. And, the independent flow channels respectively have an amount of working fluid filled therein.

5 Claims, 7 Drawing Sheets

HEAT DISSIPATION UNIT AND HEAT DISSIPATION DEVICE USING SAME

The present application is a continuation in part of U.S. patent application Ser. No. 16/251,077, filed on Jan. 18, 2019.

FIELD OF THE INVENTION

The present invention relates to a heat dissipation unit and a heat dissipation device using same, and more particularly, to a heat dissipation unit and a heat dissipation device using same, which have largely increased heat dissipation efficiency.

BACKGROUND OF THE INVENTION

The currently available mobile devices, personal computers, servers, communication chasses, and many other electronic systems and apparatuses all provide highly upgraded computing power. However, the powerful computing units inside these electronic systems and apparatuses also produce increasing heat when they operate. Therefore, heat dissipation units are necessary to help remove the produced heat. Among others, heat sinks, heat pipes, and vapor chambers are the heat dissipation elements that are most frequently chosen by users for removing heat from their electronic devices. In the case of large-area heat dissipation, heat dissipation devices together with cooling fans are usually used to enable forced heat dissipation.

Generally, a heat dissipation device includes a base and a plurality of radiation fins located on one side of the base. In response to the increasing heat produced by the electronic elements with highly upgraded computing power, the radiation fins on the base must have a correspondingly increased size/height to provide more areas for more quickly dissipating the produced heat from the electronic devices. However, the heat dissipation efficiency of the radiation fins is reduced with the increased height thereof, which in turn results in lowered heat dissipation efficiency of the entire heat dissipation device.

In conclusion, the conventional heat dissipation device has the following disadvantages: (1) having very low heat dissipation efficiency; and (2) having a relatively large volume.

It is therefore tried by the inventor to develop an improved heat dissipation unit and a heat dissipation device using same, in order to overcome the disadvantages of the conventional heat dissipation device.

SUMMARY OF THE INVENTION

A primary object of the present invention is to provide a heat dissipation unit that has largely increased heat dissipation efficiency.

Another object of the present invention is to provide a heat dissipation unit that enables a heat dissipation device using same to have a largely reduced volume.

A further object of the present invention is to provide a heat dissipation device that has largely increased heat dissipation efficiency.

A still further object of the present invention is to provide a heat dissipation device that has a largely reduced volume.

To achieve the above and other objects, a preferred embodiment of the heat dissipation unit according to the present invention includes at least one radiation fin, which is formed by correspondingly closing a first plate member and a second plate member to each other, such that a plurality of independent flow channels is defined between the closed first and second plate members. The independent flow channels communicate with each other. And, the independent flow channels respectively have an amount of working fluid filled therein.

To achieve the above and other objects, a preferred embodiment of the heat dissipation device according to the present invention includes a base and a heat dissipation unit. The base has a first side and an opposite second side; and the heat dissipation unit includes at least one radiation fin correspondingly provided on the first side of the base. The radiation fin is formed by correspondingly closing a first plate member and a second plate member to each other, such that a plurality of independent flow channels is defined between the closed first and second plate members. And, the independent flow channels respectively have an amount of working fluid filled therein.

According to the structural design of the present invention, by means of the independent flow channels disposed in the radiation fin in communication with each other, when the second side of the base is in contact with a heat source, heat produced by the heat source is absorbed by the base and transferred from the second side to the first side of the base and then to the radiation fins. The heat transferred to the radiation fins is then absorbed by the working fluid in the independent flow channels in the radiation fins. When the working fluid is heated and vaporized in the independent flow channels in communication with each other, heat is quickly carried by the vapor-phase working fluid to another ends of the independent flow channels that are farther away from the heat source. At the farther ends of the independent flow channels, the vapor-phase working fluid is condensed to a liquid. With the aid of at least one wick structure provided on the inner wall surfaces of the independent flow channels, the liquid-phase working fluid flows back to the ends of the independent flow channels that are closer to the heat source. In this way, the liquid-vapor circulation of the working fluid continues in the radiation fins to achieve the effect of quick heat dissipation to largely upgrade the heat dissipation efficiency of the heat dissipation device.

In another operable embodiment of the heat dissipation device according to the present invention, when the second side of the base is in contact with a heat source, heat produced by the heat source is absorbed by the base and transferred from the second side to the first side of the base and then to the radiation fins. The heat transferred to the radiation fins is further transferred to a plurality of heat transfer elements, which are sandwiched between the first and second plate members of the radiation fins to define the independent flow channels in communication with each other therein. The heat transferred to the heat transfer elements is then absorbed by the working fluid in the independent flow channels in the heat transfer elements. Similarly, the liquid-vapor circulation of the working fluid in the independent flow channels upgrades the heat dissipation efficiency of the heat dissipation device.

Further, by providing the independent flow channels in communication with each other in the radiation fins or by providing the heat transfer elements between the first and the second plate members of the radiation fins, it is able to overcome the problem of poor heat dissipation efficiency in the conventional heat dissipation device caused by the excessively large volume of the radiation fins. In the present invention, the provision of the independent flow channels in the radiation fins to enable liquid-vapor circulation of the working fluid in each of the radiation fins allows the heat dissipation device of the present invention to have a largely reduced overall volume while having even better heat dissipation efficiency than the conventional heat dissipation device.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
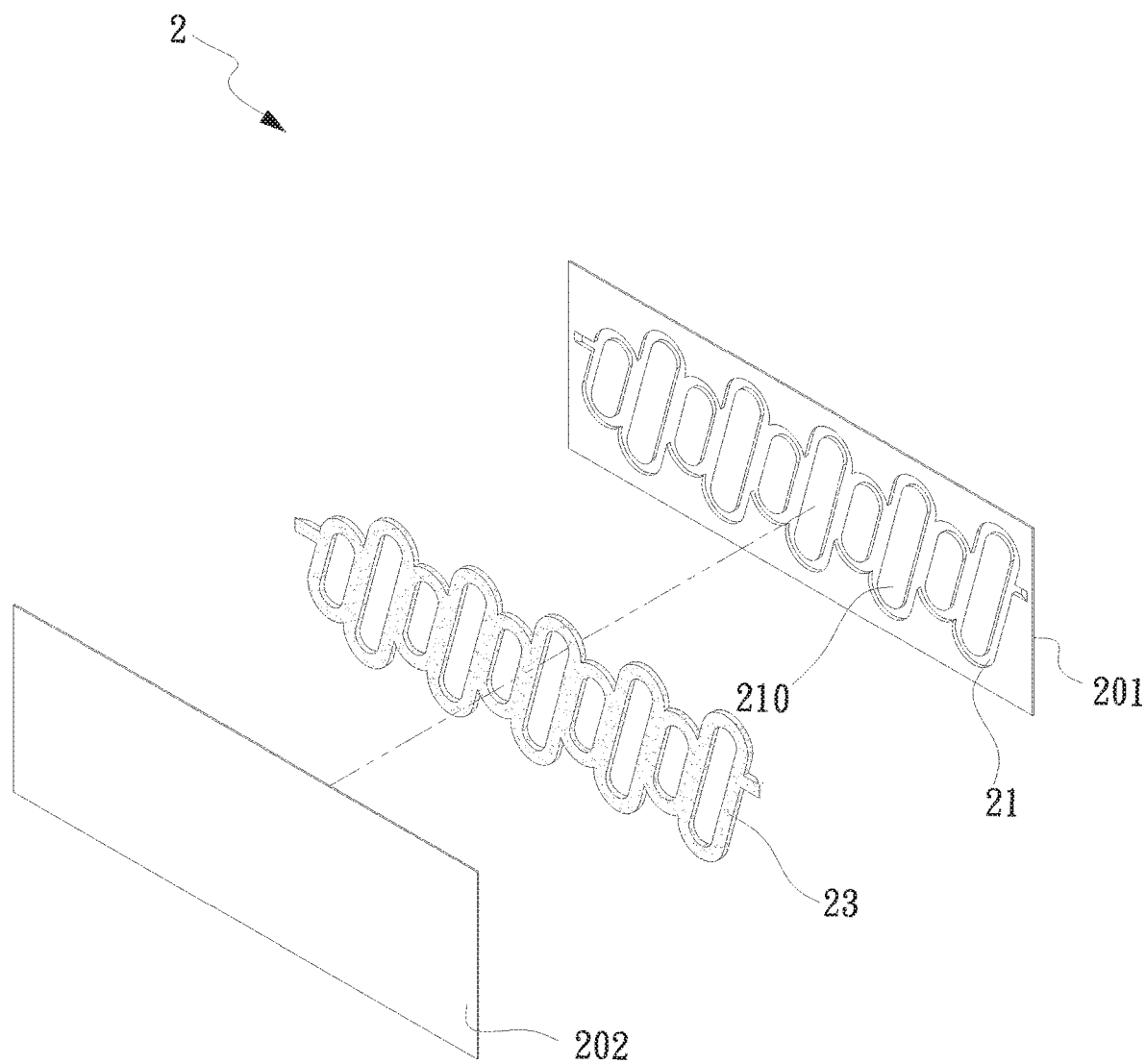
FIG. 1 is an exploded perspective view of a first embodiment of the heat dissipation unit according to the present invention.

The present invention will now be described with some preferred embodiments thereof and by referring to the accompanying drawings. For the purpose of easy to understand, elements that are the same in the preferred embodiments are denoted by the same reference numerals.

Figure 2:
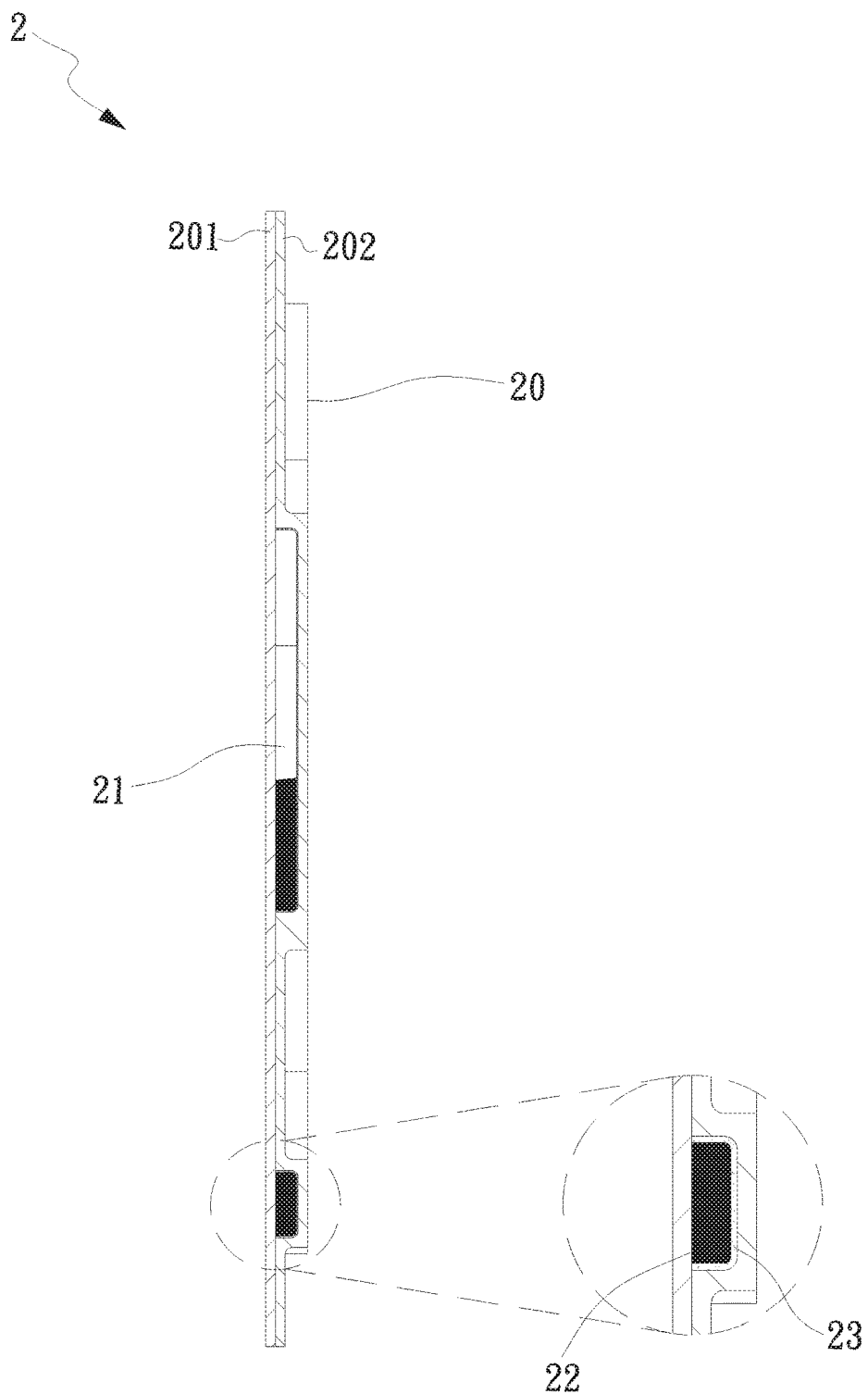
FIG. 2 is a sectional view of the heat dissipation unit of FIG. 1.
Figure 3:
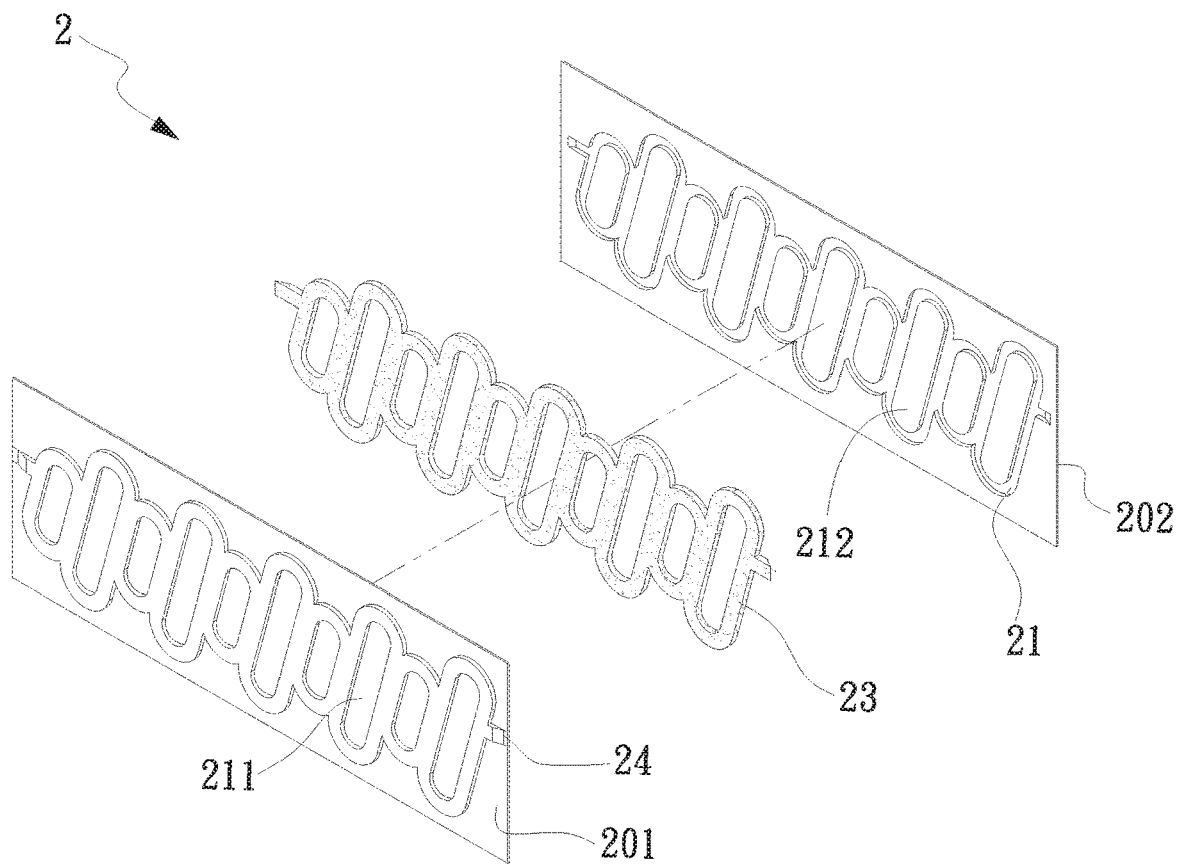
FIG. 3 is an exploded perspective view of a second embodiment of the heat dissipation unit according to the present invention.

Please refer to FIGS. 1 and 2, which are exploded perspective and sectional views, respectively, of a first embodiment of a heat dissipation unit 2 according to the present invention. As shown, the heat dissipation unit 2 in the first embodiment thereof includes at least one radiation fin 20, which is formed by correspondingly closing a first plate member 201 and a second plate member 202 to each other. In the first embodiment, the first plate member 201 is formed with one or more recesses 210. However, it is understood the recesses 210 can be otherwise formed on the second plate member 202. More specifically, one of the first and the second plate members 201, 202 of the radiation fin 20 is formed with the recesses 210, while the other one of them is a flat member without any recess 210 formed thereon. The first and second plate members 201, 202 are correspondingly mated with each other, whereby the recesses 210 of the first plate member 201 and the second plate member 202 form multiple independent flow channels 21 in communication with each other. As shown in FIG. 3, each of the independent flow channels 21 is internally provided with a working fluid 22 for heat transfer through liquid-vapor circulation of the working fluid 22 in the independent flow channel 21. Further, each of the independent flow channels 21 has at least one wick structure 23 or a layer of coating provided on inner wall surfaces thereof. The wick structure 23 can be a mesh structure, a fibrous structure, a porous structure or a grooved structure, and is mainly used to enhance the liquid-vapor circulation of the working fluid 22 in the independent flow channels 21.

The coating can be provided on one or both of the inner wall surfaces of the independent flow channels 21 and the wick structure 23.

Figure 4:
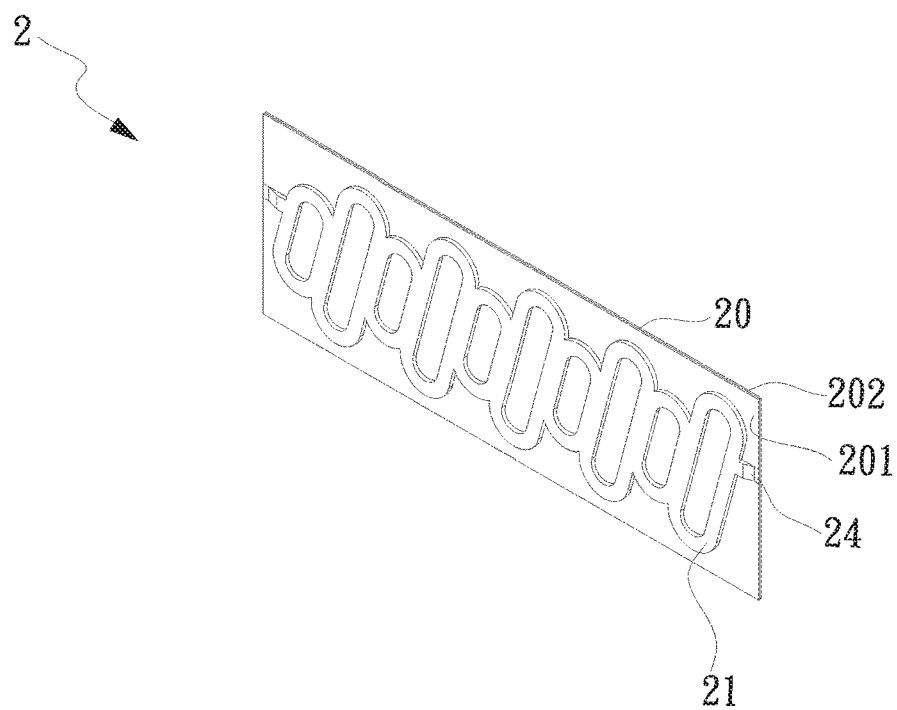
FIG. 4 is an assembled perspective view of the heat dissipation unit of FIG. 3.
Figure 5:
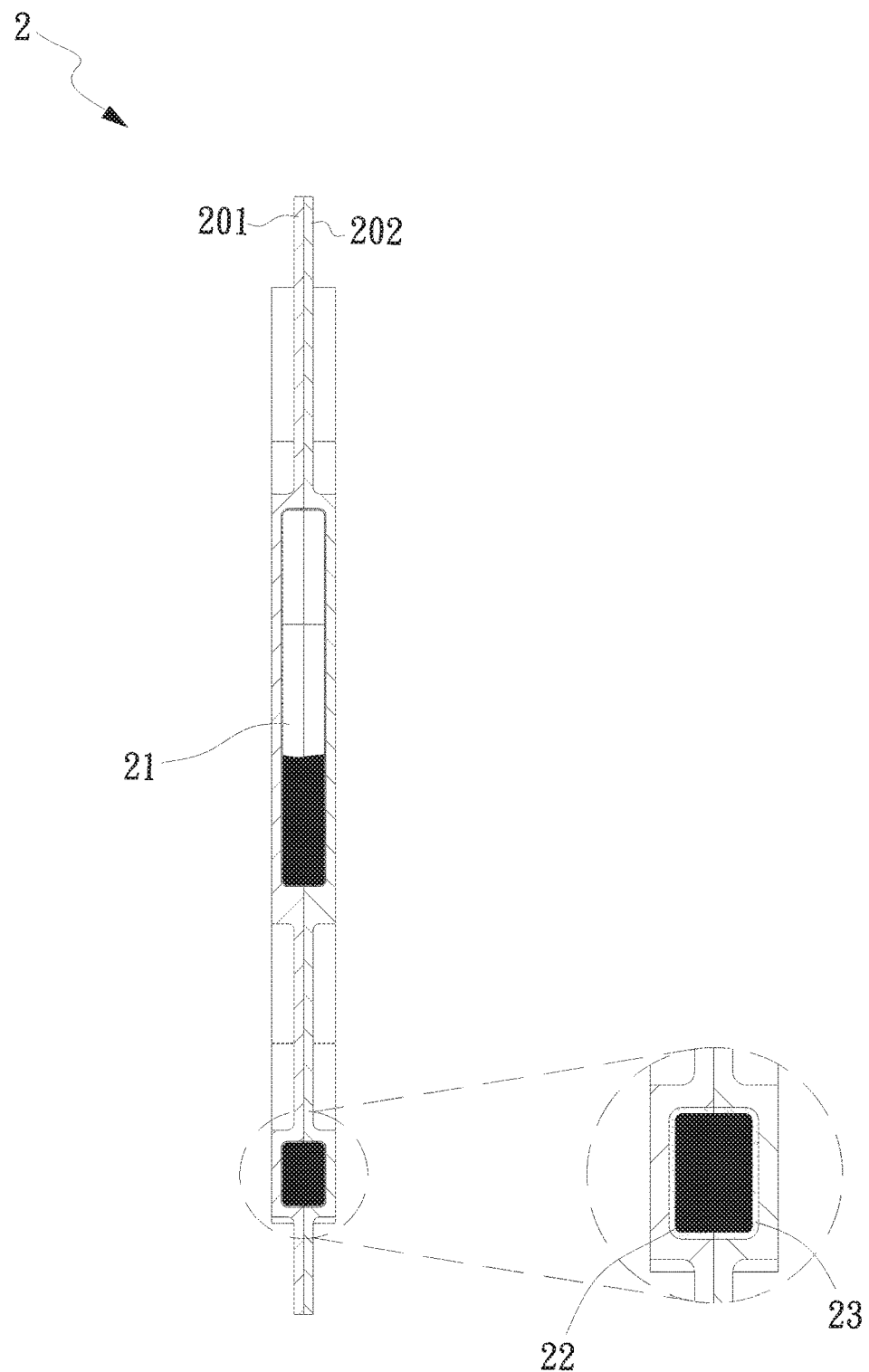
FIG. 5 is a sectional view of the heat dissipation unit of FIG. 3.

Please refer to FIGS. 3, 4 and 5, which is an assembled perspective and a sectional view of a second embodiment of the heat dissipation unit according to the present invention. Unlike the first embodiment, the heat dissipation unit in the second embodiment thereof includes at least one radiation fin 20, of which the first plate member 201 and the second plate member are formed with one or more first recesses 211 and one or more second recesses 212, respectively. In other words, in the second embodiment, both of the first and the second plate member 201, 202 of the radiation fin 20 have recesses formed thereon. Further, when the first and the second plate member 201, 202 are correspondingly closed to each other, the first recesses 211 and the second recesses 212 are brought to face and close one another in one-to-one correspondence to thereby form a plurality of independent flow channels 21 between the closed first and second plate members 201, 202. As shown in FIG. 5, the independent flow channels 21 in the second embodiment of the heat dissipation unit of the present invention are also internally provided with a working fluid 22 and at least one wick structure 23.

To manufacture the radiation fin 20, first perform a mechanical process on one of the first and the second plate member 201, 202 to form the recesses 210; or perform the mechanical process on both of the first and the second plate member 201, 202 to form the first and the second recesses 211, 212, respectively. The mechanical process includes a first step of stamping one or both of the first and the second plate member 201, 202 to form the recesses 210 or the first and the second recesses 211, 212; and a second step of correspondingly closing and fixedly holding the first and the second plate member 201, 202 to each other by welding or any other suitable way, such that the recesses 210 formed on the first plate member 201 or the second plate member 202 form the independent flow channels 21, or the first and the second recesses 211, 212 formed on the first plate member 201 and the second plate member 202 form the independent flow channels 21. Thereafter, air is evacuated from the independent flow channels 21 and a working fluid 22 is filled into the independent flow channels 21 via a fluid filling port 24 provided on the radiation fin 20 (see FIG. 6). Finally, peripheral edges of the recesses 210 or of the paired and closed first and second recesses 211, 212 as well as the fluid filling port 24 are sealed to complete the radiation fin 20. Herein, the working fluid 22 can be aqua ammonia, a coolant, water, hydrocarbon, or any other suitable compound.

Figure 7:
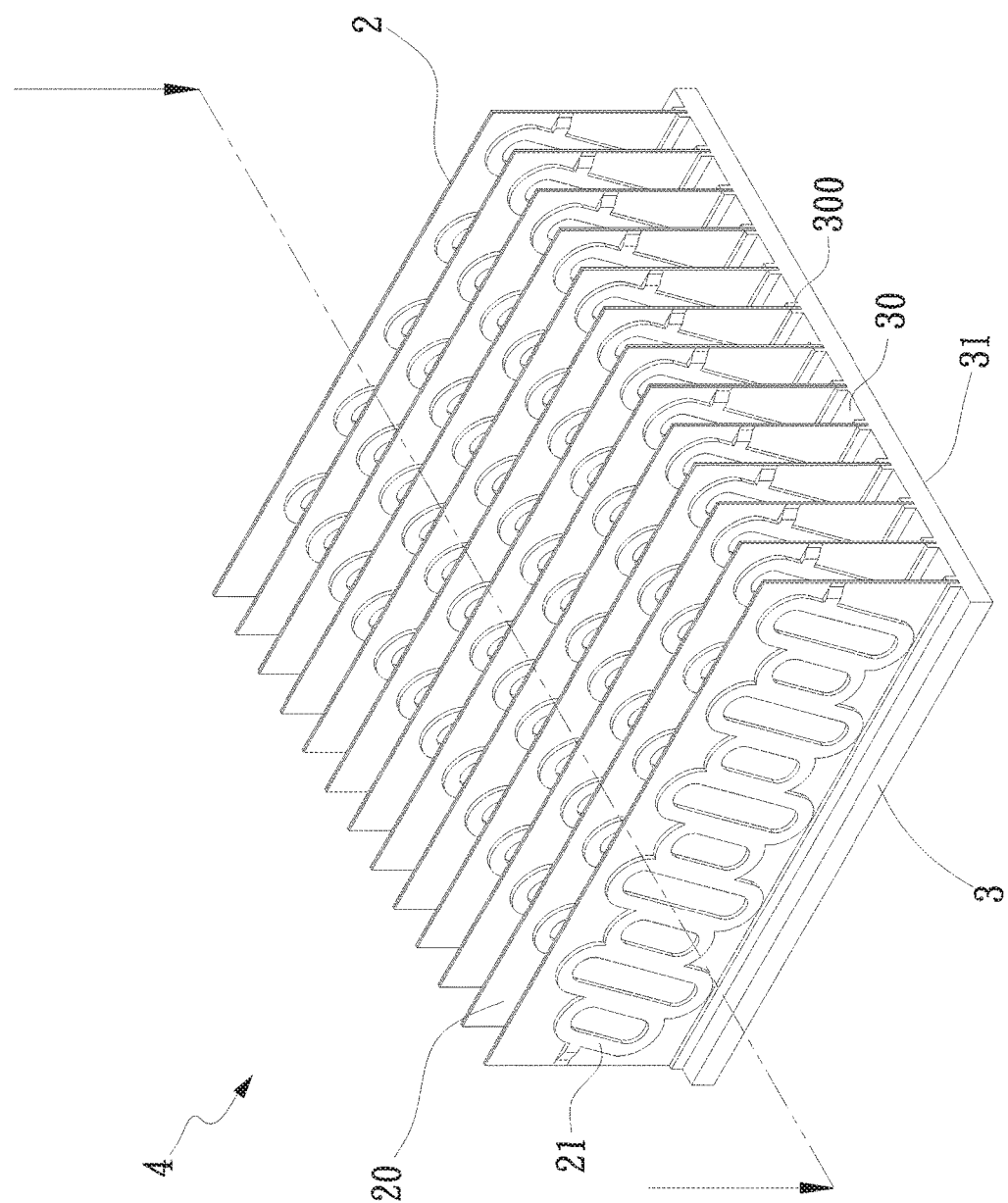
FIG. 7 is an assembled perspective view of a first and a second embodiment of the heat dissipation unit according to the present invention.

It is noted the recesses 210 or the first and second recesses 211, 212 are not limited to any specific shape, size, arrangement, or extending direction. For example, in a third embodiment of the heat dissipation unit 2, as shown in FIG. 7, the recesses 210 formed on the first or the second plate member 201, 202 are different in length and the longer and the shorter recesses 210 are arranged alternately. In the first embodiment of the heat dissipation unit 2 shown in FIG. 4, the recesses 210 are parallelly formed on the first or the second plate member 201, 202 to extend in a direction perpendicular to two opposite edges of the first or the second plate member 201, 202. Of course, the recesses 210 can be otherwise parallelly formed on the first or the second plate member 201, 202 to extend at an angle with respect to two opposite edges of the first or the second plate member 201, 202, similar to that shown in FIG. 7. That is, the shape, size, arrangement and extending direction of the recesses 210 or of the first and second recesses 211, 212 can be adjusted according to actual need in use, so long as when the first and second plate members 201, 202 are mated with each other, the recesses 210 or the paired first and second recesses 211, 212 can form the independent flow channels 21. In addition, the aforesaid coating (not shown) can be provided on inner wall surfaces of the independent flow channels 21 and on the wick structure 23 or therebetween to enhance the liquid-vapor circulation of the working fluid 22 in the independent flow channels 21

Figure 6:
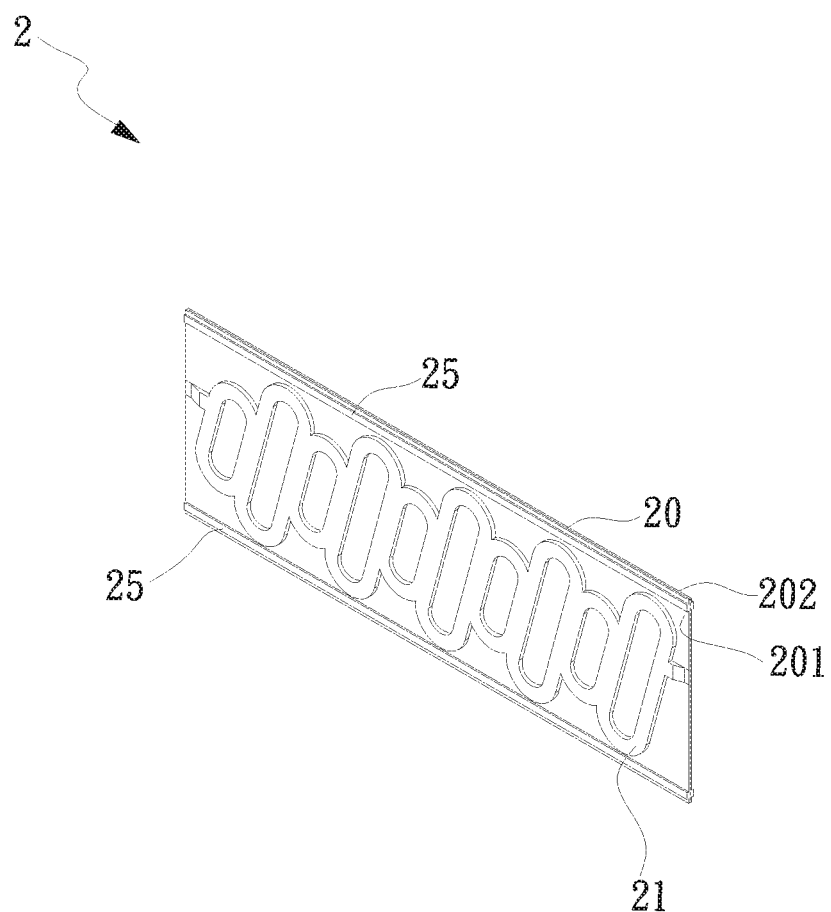
FIG. 6 is an assembled perspective view of a third embodiment of the heat dissipation unit according to the present invention.

Please refer to FIGS. 6, which is an assembled perspective view of a third embodiment of the heat dissipation unit according to the present invention. The third embodiment is different from the first and the second one in that it further formed with multiple ribs 25. The ribs 25 are not particularly limited in number, extending direction and arrangement, which can be freely adjusted according to actual need in use. For example, the ribs 25 can be longitudinally or transversely extended with respect to the radiation fin 20 or be arranged on the radiation fin 20 in a staggered manner. The purpose of the ribs 25 is to give the radiation fin 20 an increased structural strength, lest the radiation fin 25 should be easily deformed.

Please refer to FIG. 7, which is an assembled perspective view of a first and a second embodiment of the heat dissipation unit according to the present invention. As shown, in the first and second embodiment thereof, the heat dissipation device 4 includes one or more heat dissipation units 2 described above and a base 3. The base 3 has a first side 30 and an opposite second side 31. On the first side 30 of the base 3, one or more fixing grooves 300 are formed for respectively fixedly holding one piece of the radiation fin 20 thereto. The radiation fins 20 can be fixedly held to the fixing grooves 300 through interference-fit, riveting, welding, adhesive bonding, or snap-fit.

Figure 8:
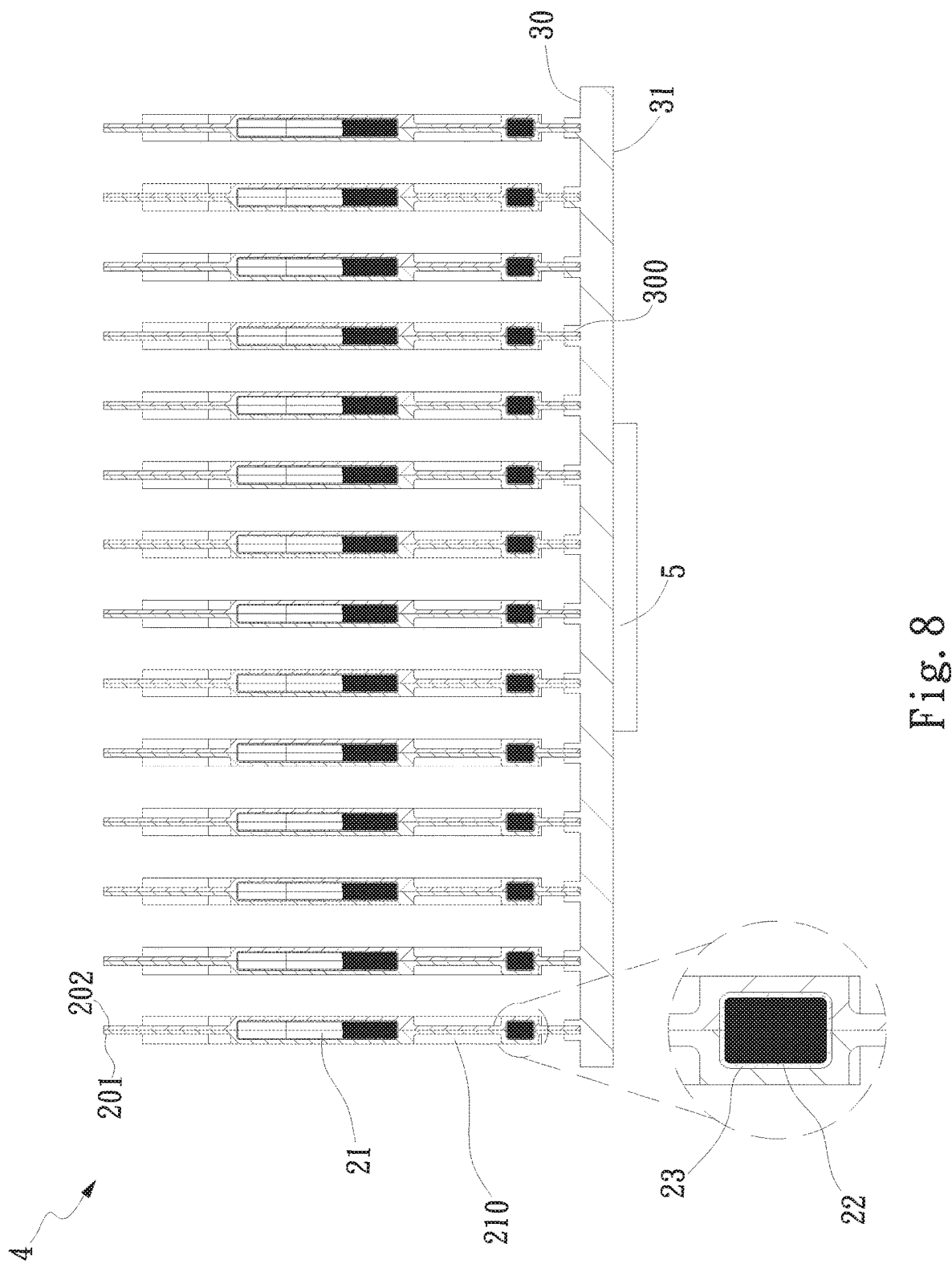
FIG. 8 is a sectional view of a second embodiment of the heat dissipation device according to the present invention.

As can be seen in FIG. 8, when the second side 31 of the base 3 is in contact with a heat source 5, heat produced by the heat source 5 is absorbed by the base 3 and transferred from the second side 31 to the first side 30 of the base 3 and then to the radiation fins 20. The heat transferred to the radiation fins 20 is then absorbed by the working fluid 22 in the independent flow channels 21 in the radiation fins 20. When the working fluid 22 is heated and vaporized in the independent flow channels 21, heat is quickly carried by the vapor-phase working fluid 22 to another ends of the independent flow channels 21 that are farther away from the heat source 5. At the farther ends of the independent flow channels 21, the vapor-phase working fluid 22 is condensed to a liquid. With the aid of the wick structure 23 provided on the inner wall surfaces of the independent flow channels 21, the liquid-phase working fluid 22 flows back to the ends of the independent flow channels 21 that are closer to the heat source 5. In this way, the liquid-vapor circulation of the working fluid 22 continues in the radiation fins 20 to achieve the effect of quick heat dissipation to largely upgrade the heat dissipation efficiency of the heat dissipation device 4.

By providing the independent flow channels 21 in communication with each other in the radiation fins 20, it is also able to overcome the problem of poor heat dissipation efficiency of the conventional heat dissipation device due to the large volume of the radiation fins thereof. In other words, in the present invention, the provision of the independent flow channels 21 in the radiation fins 20 to enable liquid-vapor circulation of the working fluid 22 in each of the radiation fins 20 allows the heat dissipation device 4 of the present invention to have a largely reduced overall volume while having even better heat dissipation efficiency than the conventional heat dissipation device.

In conclusion, compared to the conventional heat dissipation device, the present invention has the following advantages: (1) having largely upgraded heat dissipation efficiency; and (2) having a largely reduced overall volume.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A heat dissipation unit, comprising a base and a plurality of radiation fins attached to a first side of the base, each of the radiation fins comprising:
    a first plate member;
    a second plate member closed to the first plate member, one or both of the first and second plate members having a plurality of recesses depressed on one surface and protruding on an opposite surface of the one or both of the first and second plate members;
    a plurality of flow channels defined between the closed first and second plate members, the plurality of flow channels connected together such that they are in fluid communication with one another;
    a wick structure provided in the plurality of flow channels, the wick structure having the same three dimensional shape as the plurality of flow channels; and
    working fluid filled in the plurality of flow channels, wherein outer faces of the first and second plate members are configured to directly exchange heat with ambient air such that heat of a heat source attached to a second side of the base is transferred to the radiation fins, is absorbed by the working fluid in the plurality of flow channels, and is carried by the working fluid in a vapor phase to ends of the plurality of independent flow channels that are distal the base.

2. The heat dissipation unit of claim 1, wherein the plurality of recesses include a plurality of first recesses formed on the first plate member and a plurality of second recesses formed on the second plate member and wherein the correspondingly closed first and second plate members bring the first recesses and the second recesses to face and close one another in one-to-one correspondence, such that the paired and closed first and second recesses form the plurality of flow channels.

3. The heat dissipation unit of claim 1, wherein the recesses are formed on the radiation fins by a mechanical process of stamping.

4. The heat dissipation unit of claim 1, wherein the wick structure provided therein is selected from the group consisting of a mesh structure, a fibrous structure, and a porous structure.

5. The heat dissipation unit of claim 4, wherein the radiation fins further include a coating provided on inner wall surfaces of the flow channels and/or the wick structure.

\* \* \* \* \*